United States Patent [19]

Jackson

[11] Patent Number: 5,194,831
[45] Date of Patent: Mar. 16, 1993

[54] FULLY-DIFFERENTIAL RELAXATION-TYPE VOLTAGE CONTROLLED OSCILLATOR AND METHOD THEREFOR

[75] Inventor: H. Spence Jackson, Austin, Tex.
[73] Assignee: Motorola, Inc., Schaumburg, Ill.
[21] Appl. No.: 835,835
[22] Filed: Feb. 18, 1992
[51] Int. Cl.$^5$ .................. H03B 5/24; H03B 3/023
[52] U.S. Cl. .................. 331/111; 331/143; 331/177 R; 307/497
[58] Field of Search .................. 331/108 C, 111, 143, 331/177 R; 307/494, 495, 496, 497, 350

[56] References Cited

U.S. PATENT DOCUMENTS 4,742,315  5/1988  Schreilechner ............. 331/177 R X

OTHER PUBLICATIONS

"A 30-MHz Low-Jitter High-Linearity CMOS Voltage-Controlled Oscillator", by Wakayama and Abidi, in IEEE Journal of Solid-State Circuits, vol. SC-22, No. 6, Dec. 1987, pp. 1074–1081.
"MOS Oscillators with Multi-Decade Tuning Range and Gigahertz Maximum Speed", by Banu, in IEEE Journal of Solid-State Circuits, vol. 23, No. 6, Dec. 1988, pp. 1386–1393.

Primary Examiner—David Mis
Attorney, Agent, or Firm—Paul J. Polansky

[57] ABSTRACT

A fully-differential relaxation-type voltage controlled oscillator (VCO) (30) includes an operational transconductance amplifier (OTA) (31) for receiving a differential input voltage. The OTA (31) provides a charging current to a capacitor (33) proportional to the differential input voltage during a first phase of an output signal, and provides a discharging current to the capacitor (33) proportional to the differential input voltage during a second phase of the output signal. A comparator having hysteresis (34) detects the charge on the capacitor. A latching portion (35) latches the output of the comparator (34) to provide non-overlapping clock signals.

11 Claims, 3 Drawing Sheets

FULLY-DIFFERENTIAL RELAXATION-TYPE VOLTAGE CONTROLLED OSCILLATOR AND METHOD THEREFOR

FIELD OF THE INVENTION

This invention relates generally to electrical circuits, and more particularly, to voltage controlled oscillators (VCOs).

BACKGROUND OF THE INVENTION

Voltage controlled oscillators (VCOs) are useful in a wide variety of electrical circuits. For example, VCOs are building blocks for phase locked loops (PLLs) which are used in FM receivers and in other communications systems. A VCO receives an input voltage, and generates an output signal at a frequency proportional to the input voltage.

Several types of VCOs are known in the art. One type is a crystal-controlled VCO. The crystal VCO includes an inverter connected across the terminals of a crystal. One capacitor has a first terminal connected to a first terminal of the crystal and another terminal connected to a second terminal of the crystal and another terminal connected to a negative power supply voltage. A varactor is connected between the second terminal of the first capacitor and the negative power supply voltage.

Another type is a modification of a ring oscillator. A ring oscillator has an odd number of inversion stages. The output of the last stage is connected to the input of the first stage. Oscillation occurs because a given logic state on the input of a first inversion stage propagates through an odd number of inversion stages. A signal inverted from the original input of the first stage eventually is presented to the input of the first stage. The output of the last stage thus oscillates at a frequency determined by the propagation delay through all the stages. A ring oscillator may be made into a VCO by making the delay proportional to the input voltage. For example, if complementary-metal-oxide-semiconductor (CMOS) technology is used, each inverter stage includes a standard CMOS inverter. The ring oscillator VCO includes an additional transistor in the CMOS inverter. A P- or N-channel transistor is connected between the source of the transistor of the same conductivity type and the source-side supply. The input voltage is then applied to the gate of the additional transistor, thus controlling the switching speed.

Yet another known type of oscillator is a relaxation oscillator. The relaxation oscillator relies on charging times of a capacitor to determine the frequency of the output signal. As the input voltage varies, the rate of charging of the capacitor similarly varies.

Each of these known oscillators has problems in their operation which become more critical as integrated circuit performance increases and cost decreases. The ring and relaxation oscillator VCOs are each susceptible to noise-induced jitter on the output signal. The crystal VCO requires both an external crystal and varactor, which are expensive in terms of both component cost and pin count. Thus, new VCO designs with intolerance to noise-induced jitter and low cost are needed.

SUMMARY OF THE INVENTION

Accordingly, there is provided, in one form, a relaxation-type voltage controlled oscillator comprising an operational transconductance amplifier (OTA), a charging capacitor, a coupling portion, a comparator, and a latching portion. The OTA receives an input voltage and provides first and second differential currents restrictively to first and second output terminals in response thereto. The charging capacitor has first and second terminals. The coupling portion couples either, the first output terminal of the OTA to the first terminal of the charging capacitor and the second output terminal of the OTA to the second terminal of the charging capacitor, or the first output terminal of the OTA to the second terminal of the charging capacitor and the second output terminal of the OTA to the first terminal of the charging capacitor, selectively in response to first and second output signals of the relaxation-type voltage controlled oscillator. The comparator has first and second inputs respectively coupled to the first and second terminals of the charging capacitor, and provides third and fourth output signals in response thereto. The comparator is characterized as having a predetermined hysteresis. The latching portion latches the third and fourth output signals to provide the first and second output signals of the relaxation-type voltage controlled oscillator.

These and other features and advantages will be more clearly understood from the following detailed description taken in conjunction with the accompanying drawings.

DETAILED DESCRIPTION OF THE INVENTION

Figure 1:
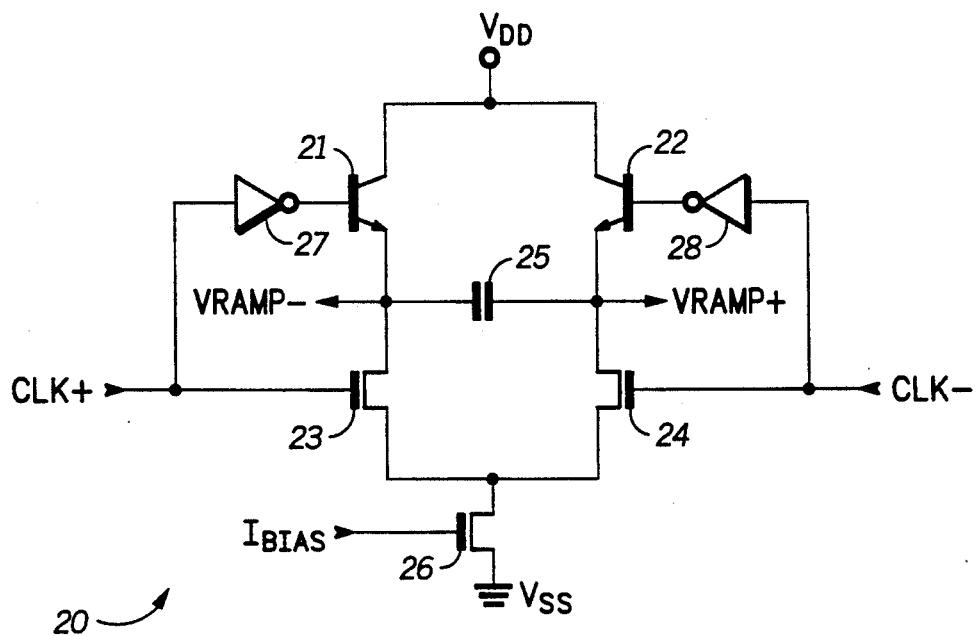
FIG. 1 illustrates in partial schematic form and partial logic diagram form a relaxation-type voltage-controlled oscillator (VCO) core known in the prior art.

FIG. 1 illustrates in partial schematic form and partial logic diagram form a relaxation-type voltage-controlled oscillator (VCO) core 20 known in the prior art. VCO core 20 was disclosed by Wakayama and Abidi in "A 30-MHz Low-Jitter High Linearity CMOS Voltage Controlled Oscillator", *IEEE Journal of Solid State Circuits*, vol. SC-22, no. 6, December 1987, pp. 1074–1081. VCO core 20 includes NP transistors 21 and 22, N-channel transistors 23 and 24, a capacitor 25, an N-channel transistor 26, and inverters 27 and 28. Transistors 21 and 22 each have a collector connected to a power supply voltage terminal labelled "$V_{DD}$", a base, and an emitter, the emitters of transistors 21 and 22 respectively providing signals labeled "VRAMP−" and "VRAMP+". $V_{DD}$ is a more-positive power supply voltage terminal typically at 50 volts. Transistors 23 has a drain connected to the emitter of transistor 21, a gate for receiving a clock signal labelled "CLK+", and a source. Transistor 24 has drain connected to the emitter of transistor 22, a gate of receiving a clock signal labeled "CLK−", and a source connected to the source of transistor 23. Capacitor 25 has a first terminal connected to the emitter of transistor 21, and a second terminal connected to the emitter of transistor 22. Transistor 26 has a drain connected to the source of transistors 23 and 24, a gate for receiving a signal labelled "$I_{BIAS}$", and a source connected to a power supply voltage terminal labeled "$V_{SS}$". $V_{SS}$ is a more-negative power supply voltage terminal and is typically at zero volts. Inverter 27 has an input terminal for receiving signal CLK+, and an input terminal connected to the base of transistor 21. Inverter 28 has an input terminal for receiving signal CLK−, and an output terminal connected to the base of transistor 21.

Signals CLK+ and CLK− are output signals of the VCO of which VCO core 20 is a part and are substantially complementary. $I_{BIAS}$ is a voltage which biases transistor 26 to conduct a current proportional to an input voltage (not shown). When signal CLK+ is a logic high (and signal CLK− is a logic low), transistors 23 is conductive and transistor 24 is nonconductive. Inverter 28 provides a logic high voltage at the base of transistor 22, causing the second terminal of capacitor 25 to be at ($V_{DD}-V_{BE}$), where $V_{BE}$ represents a forward-biased diode voltage drop. Transistors 23 and 26 decrease signal VRAMP-(the voltage at the first terminal of capacitor 25) at a rate determined by both the amount of current conducted through transistor 26 (which in turn depends on signal $I_{BIAS}$), and the value of capacitor 25. Since $I_{BIAS}$ is proportional to the input voltage, the rate at which capacitor 25 charges is determined by the input voltage. When VRAMP+ exceeds VRAMP− by 2.5 volts, a differential dynamic latch (not shown) reverses the logic states of signals CLK+ and CLK−.

When the comparator circuit switches CLK+ to a logic low and CLK− to a logic high, transistors 21, 24, and 26 provide a current path to charge capacitor 25 in the opposite direction. However, signal VRAMP+ is boosted an additional 2.5 volts, to approximately ($V_{DD}-V_{BE}+2.5$). Thus the boosting effect of capacitor 25 is used to achieve a 5-volt swing on signals VRAMP− and VRAMP+.

A VCO based on VCO core 20 has a high sensitivity to power supply noise. The logic high voltages of inverters 27 and 28 are substantially at $V_{DD}$, and the logic high voltages of VRAMP+ and VRAMP− are clamped at ($V_{DD}-V_{BE}$). Thus, any noise on $V_{DD}$ affects the rate of charging of transistor 25, and hence the period of signals CLK+ and CLK−. Furthermore, to achieve a wide tuning range, the gain of VCO core 20 is very high, and if the VCO is used in a PLL, any noise on the PLL's loop filter (not shown) is multiplied by the gain of VCO core 20. Thus, a new VCO with low jitter but also with low power supply sensitivity is needed.

Figure 2:
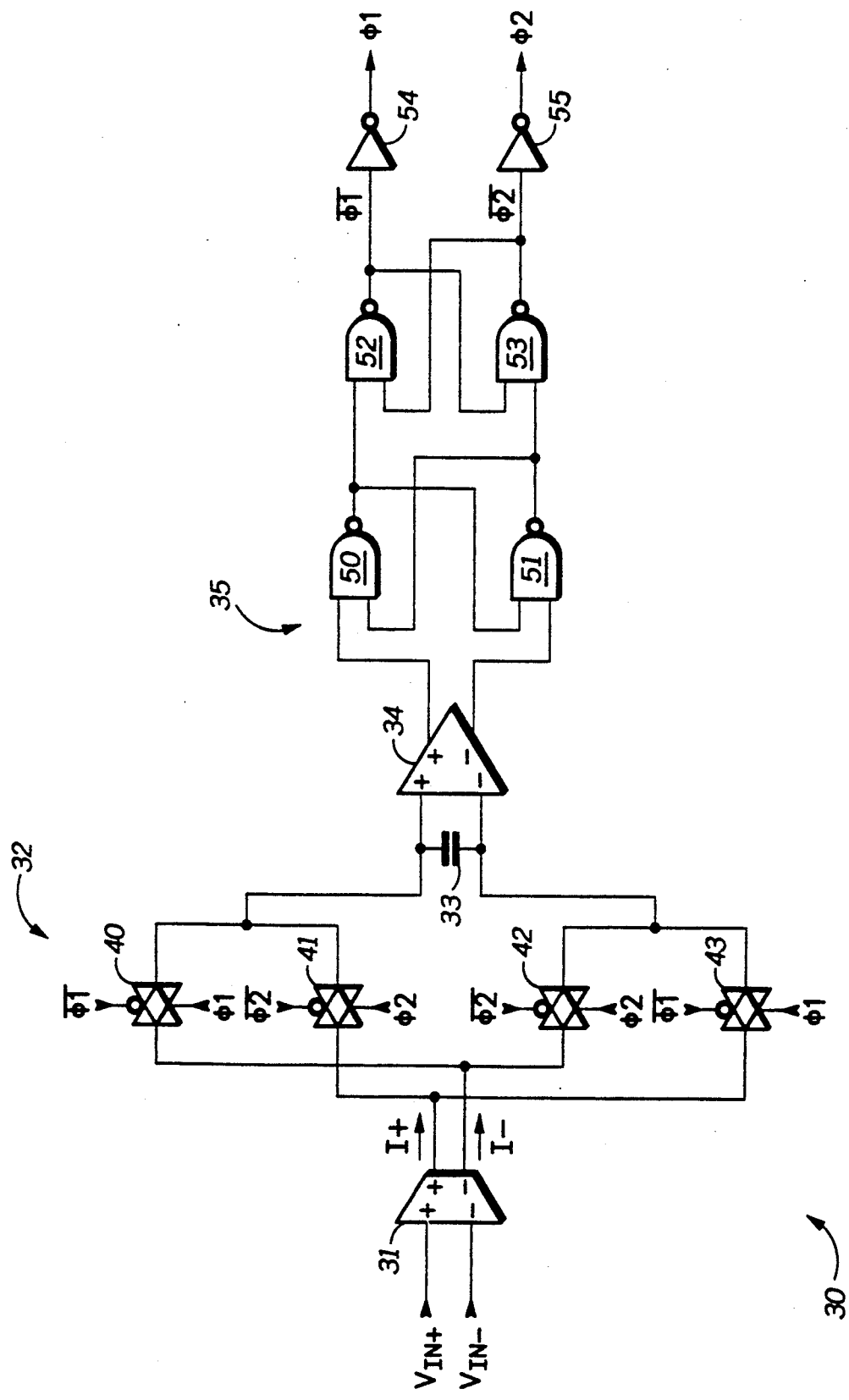
FIG. 2 illustrates in partial schematic form and partial logic diagram form a fully differential relaxation-type VCO in accordance with the present invention.

The present invention provides such a VCO. FIG. 2 illustrates in partial schematic form and partial logic diagram form a fully differential relaxation-type VCO 30 in accordance with the present invention. VCO 30 includes generally an operational transconductance amplifier (OTA) 31, a selective switching portion 32, a capacitor 33, a comparator with hysteresis 34, and a latching portion 35. Selective switching portion 32 includes transfer gates 40-43. Latching portion 35 includes NAND gates 50-53, and inverters 54 and 55.

OTA 31 has a positive input terminal for receiving a signal labelled "$V_{IN+}$", a negative input terminal for receiving a signal labelled "$V_{IN-}$", a positive output terminal for providing an output current signal labelled "I+", and a negative output terminal for providing an output current signal labelled "I−". In selective switching portion 32, transmission gate 40 has a first terminal connected to the negative output terminal of OTA 31, a second terminal, a true control terminal for receiving signal Φ1, and a complement input terminal for receiving a signal labelled $\overline{\Phi 1}$. Transmission gate 41 has a first terminal connected to the positive output terminal of OTA 31, a second terminal connected to the second terminal of transmission gate 40, a true control terminal for receiving signal Φ2 and a complement input terminal for receiving a signal labelled $\overline{\Phi 2}$. Transmission gate 42 has a first terminal connected to the negative output terminal of OTA 31, a second terminal, a true control terminal for receiving signal Φ2, and a complement input terminal for receiving a signal labelled $\overline{\Phi 2}$. Transmission gate 43 has a first terminal connected to the positive output terminal of OTA 31, a second terminal connected to the second terminal of transmission gate 42, a true control terminal for receiving signal Φ1, and a complement input terminal for receiving a signal labelled $\overline{\Phi 1}$. Capacitor 33 has a first terminal connected to the second terminals of transmission gates 40 and 41, and a second terminal connected to the second terminals of transmission gates 42 and 43. Comparator 34 has a positive input terminal connected to the second terminals of transmission gates 40 and 41, a negative input terminal connected to the second terminals of transmission gates 42 and 43, a positive output terminal, and a negative output terminal.

In latching portion 35, NAND gate 50 has a first input terminal connected to the positive output terminal of comparator 34, a second input terminal, and an output terminal. NAND gate 51 has a first input terminal connected to the output terminal of NAND gate 50, a second input terminal connected to the negative output terminal of comparator 34, and an output terminal connected to the second input terminal of NAND gate 50. NAND gate 53 has a first input terminal connected to the output terminal of NAND gate 50, a second input terminal, and an output terminal for providing signal $\overline{\Phi 1}$. NAND gate 53 has a first input terminal connected to the output terminal of NAND gate 52, a second input terminal connected to the output terminal of NAND gate 51, and an output terminal connected to the second input terminal of NAND gate 52 and providing output signal $\overline{\Phi 2}$ thereon. Inverter 54 has an input terminal connected to the output terminal of NAND gage 52, and an output terminal for providing signal Φ1. Inverter 55 has an input terminal connected to the output terminal of NAND gate 53, and an output terminal for providing signal Φ2.

OTA 31 receives a differential input voltage (between $V_{IN+}$ and $V_{IN-}$) and provides differential current signals I+ and I− in response. When signals Φ1 and $\overline{\Phi 1}$ are active at their respective logic states("during Φ1"), transmission gates 40 and 43 are active. Assuming $V_{IN+}>V_{IN-}$, currents I+ and I− together provide positive charging between the second and first terminals of capacitor 33. Alternatively, fi the first terminal of capacitor 33 is considered the positive terminal and the second terminal the negative terminal, then during Φ1, capacitor 33 is discharged. During Φ2, transmission gates 41 and 42 are active. Assuming $V_{IN+}>V_{IN-}$, currents I+ and I− together provides positive charging between the first and second terminals of capacitor 33. Alternatively, during Φ2, capacitor 33 is charged. If, however, $V_{IN+}<V_{IN-}$, then the periods of charging and discharging are reversed.

When the charge on capacitor 33 exceeds a predetermined threshold, comparator 34 detects a positive voltage between its positive and negative inputs, and provides a logic high voltage at the positive output terminal and a logic low voltage at the negative output terminal. NAND gates 50 and 51 form an SR flip flop, which is set in response to a logic high at the positive output terminal of comparator 34, and is reset in response to a logic high at the negative output terminal of comparator 34. NAND gates 52 and 53 function similarly and provide signals $\Phi 1$ and $\overline{\Phi 2}$ in response. Signals $\overline{\Phi 1}$ and $\overline{\Phi 2}$ have approximately a fifty-percent duty cycle. After inversion by inverters 54 and 55, signals $\Phi 1$ and $\Phi 2$ also have a duty cycle of very nearly fifty percent.

VCO 30 substantially decreases power supply voltage sensitivity. OTA 31 and comparator 34 are fully differential, and thus have high power-supply rejection ratio (PSRR) and common-mode rejection ratio (CMRR). OTA 31 charges capacitor 33 relative to its common-mode voltage, rather than relative to $V_{DD}$ or $V_{SS}$. Since OTA 31 includes common-mode feedback, any noise on the common-mode voltage will be quickly compensated. Since the hysteresis of comparator 34 is approximately 0.8 volts, OTA 31 must only provide a 0.8-volt swing on capacitor 33. In the illustrated embodiment, in which OTA 31 and comparator 34 are both implemented in 0.8 micron CMOS technology, VCO 30 has a power supply sensitivity of less than 0.5%/volt and consumes only 25 milliwatts (mW) at 25 megahertz (MHz) operating frequency. It will be apparent to those skilled in the art, however, that this performance will vary somewhat with respect to different factors such as the designs of OTA 31 and comparator 34, and minimum gate length.

Figure 3:
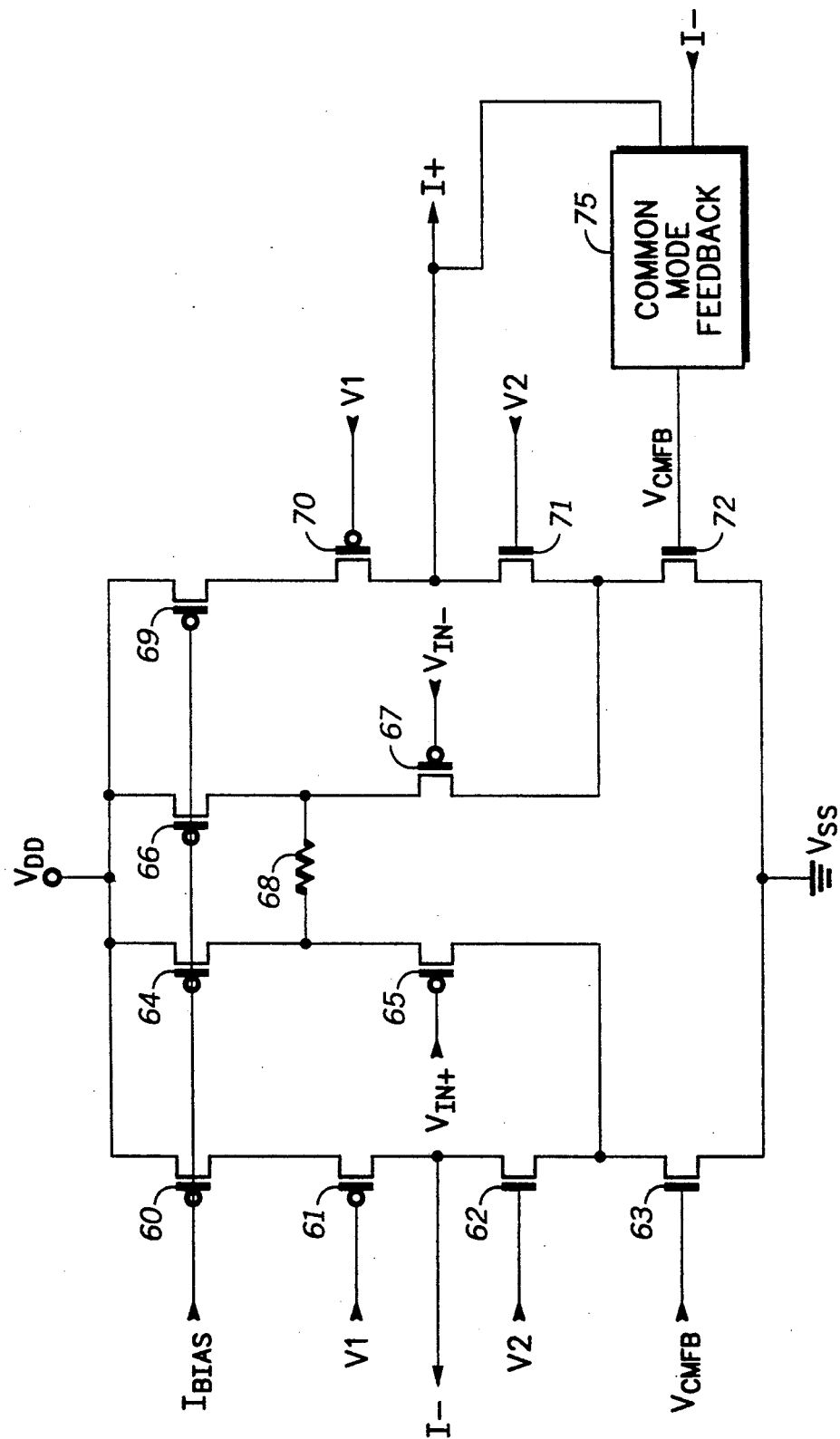
FIG. 3 illustrates in partial schematic form and partial logic diagram form the operational transconductance amplifier of FIG. 2.

FIG. 3 illustrates in partial schematic form and partial logic diagram form operational transconductance amplifier 31 of FIG. 2. OTA 31 includes P-channel transistors 60 and 61, N-channel transistors 62 and 63, P-channel transistors 64–67, a resistor 68, P-channel transistors 69 and 70, N-channel transistors 71 and 72, and a common-mode feedback block 75. Transistor 60 has a source connected to $V_{DD}$, a gate for receiving a bias signal labelled "$I_{BIAS}$", and a drain. Transistor 61 has a source connected to the drain of transistor 60, a gage for receiving a bias voltage labelled "V1", and a drain for providing current I−. Transistor 62 has a drain connected to the drain of transistor 61, a gate for receiving a bias voltage labelled "V2", and a source. Transistor 63 has a drain connected to the source of transistor 62, a gate for receiving a signal labelled "$V_{CMFB}$", and a source connected to $V_{SS}$.

Transistor 64 has a source connected to $V_{DD}$, a gate for receiving a bias signal labelled "$I_{BIAS}$", and a drain. Transistor 65 has a source connected to the drain of transistor 64, a gate for receiving signal $V_{IN+}$, and a drain connected to the drain of transistor 63. Transistor 66 has a source connected to $V_{DD}$, a gate for receiving $I_{BIAS}$, and a drain. Transistor 67 has a source connected to the drain of transistor 66, a gate for receiving signal $V_{IN-}$, and a drain. Resistor 68 has a first terminal connected to the drain of transistor 64, and a second terminal connected to the drain of transistor 67.

Transistors 69 has a source connected to $V_{DD}$, a gate for receiving signal $I_{BIAS}$, and a drain. Transistor 70 has a source connected to the drain of transistor 69, a gate for receiving signal V2, and a drain for providing current I+. Transistor 71 has a drain connected to the drain of transistor 71, a gate for receiving bias voltage V2, and a source connected to the drain of transistor 67. Transistor 72 has a drain connected to the source of transistor 71, a gate for receiving signal $V_{CMFB}$, and a source connected to $V_{SS}$. Common-mode block 75 has input terminals for receiving signals I+ and I−, and an output terminal for providing signal $V_{CMFB}$.

OTA 31 is a standard folded cascode operational amplifier with source degeneration. V1 and V2 are voltages sufficient to bias the transistors to which they are respectively applied into saturation. The differential voltage between $V_{IN+}$ and $V_{IN-}$ results in differentially greater or lesser currents I+ and I−. Resistor 68 is added to linearaize the output. For a large value of R, the transconductance is fixed and is approximately equal to (1/R). Common mode feedback loop 75 senses the common mode voltage between the output nodes and alters signal $V_{CMFB}$ in response to a difference between the sensed common mode voltage and input reference voltage $V_{REF}$. $V_{REF}$ is any desired reference voltage such as an analog ground reference voltage which is typically midway between $V_{DD}$ and $V_{SS}$. It should be appreciated that other OTAs may also be used.

Figure 4:
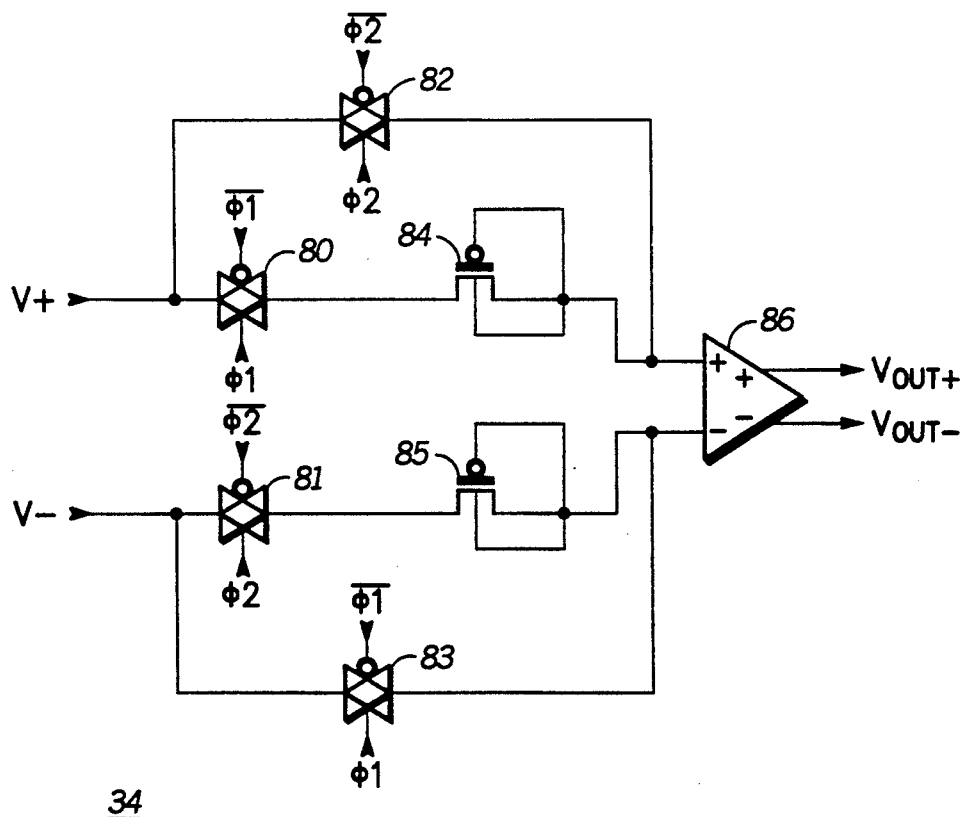
FIG. 4 illustrates in partial schematic form and partial logic diagram form the comparator with hysteresis of FIG. 1.

FIG. 4 illustrates in partial schematic form and partial logic diagram form comparator with hysteresis 34 of FIG. 2. Comparator 34 includes transmission gates 80–83, P-channel transistors 84 and 85, and a comparator 86. Transmission gate 80 has a first terminal for receiving a voltage labeled "V+", a second terminal, a true control terminal for receiving signal $\Phi 1$, and a complement control terminal for receiving signal $\overline{\Phi 1}$. The first terminal of transmission gate 80 forms the positive input terminal of comparator 34 and V+ is an input voltage corresponding to the voltages at the first material of capacitor 33 of FIG. 2. Transmission gage 81 has an first terminal for receiving for receiving a voltage labelled "V−", a second terminal, a true control terminal for receiving signal $\Phi 2$, and a complement control terminal for receiving signal $\overline{\Phi 2}$. The first terminal of transmission gate 80 forms the negative input terminal of comparator 34 and V− is an input voltage corresponding to the voltages at the second terminal of capacitor 33 of FIG. 2. Transmission gate 82 has a first terminal for receiving signal V+, a second terminal, a true control terminal for receiving signal $\Phi 2$, and a complement input terminal for receiving a signal labelled $\overline{\Phi 2}$. Transmission gate 83 has a first terminal for receiving signal V−, a second terminal, a true control terminal for receiving signal $\Phi 1$, and a complement input terminal for receiving a signal labelled $\overline{\Phi 1}$.

Transistor 84 has a source connected to the second terminal of transmission gate 80, a gate, and a bulk or substrate connected to a drain thereof. Transistor 85 has a source connected to the second terminal of transmission gate 81, a gate, and a bulk or substrate connected to a drain thereof. Comparator 86 has a positive input terminal connected to the second terminal of transmission gate 82 and to the drain of transistor 84, a negative input terminal connected to the second terminal of transmission gate 83 and to the drain of transistor 85, a positive output terminal for providing a signal labelled "$V_{OUT+}$", and a negative output terminal for providing a signal labelled "$V_{OUT-}$". Signal $V_{OUT+}$ is a voltage provided to the first input terminal of NAND gate 50 of FIG. 1, and signal $V_{OUT-}$ is a voltage provided to the second terminal of NAND gate 51 of FIG. 2.

Comparator 34 provides a digital hysteresis and is more intolerant to variations in processing than other known designs. Comparator 86 is a conventional CMOS comparator which provides $V_{OUT+}$ at a CMOS logic high voltage (approximately $V_{DD}$) and $V_{OUT-}$ at a CMOS logic low voltage (approximately $V_{SS}$) when the voltage at the positive input exceeds the voltage at the negative input thereof. Conversely, when the voltage at the negative input exceeds the voltage at the positive input thereof, $V_{OUT+}$ is at a CMOS logic low and $V_{OUT-}$ is at a CMOS logic high.

Transistors 84 and 85 provide a relatively-fixed voltage drop by having both their gates and their bulks tied to their respective drains. Thus, transistors 84 and 85 have a negative body effect or back bias, resulting in a diminished threshold voltage. In the illustrated embodiment, transistors 84 and 85 each have gate widths of 80 microns and gate lengths of 4 microns, resulting in a threshold voltage of about 0.4 volts, compared to a threshold voltage of approximately 1.0 volts for a comparable P-channel transistor with a substrate connected to $V_{DD}$.

During $\Phi 1$, transmission gates 80 and 83 are conductive, and transmission gates 81 and 82 are nonconductive. Positive input voltage V+ is offset by the voltage drop through transistor 84; i.e., V+ must exceed V− by 0.4 volts for comparator 86 to switch. During $\Phi 2$, transmission gates 80 and 83 are nonconductive, and transmission gates 81 and 82 are conductive. Negative input voltage V− is offset by the voltage drop through transistor 85; i.e., V− must exceed V+ by 0.4 volts for comparator 86 to switch. Overall, comparator 34 provides a hysteresis of about 0.8 volts. This diminished hysteresis reduces the voltage swing required across capacitor 33 of FIG. 2.

While the invention has been described in the context of a preferred embodiment, it will be apparent to those skilled in the art that the present invention may be modified in numerous ways and may assume many embodiments other than that specifically set out and described above. As noted earlier, other OTAs besides OTA 31 may be used. Also, a single-ended input OTA may be used in other embodiments. Accordingly, it is intended by the appended claims to cover all modification of the invention which fall within the true spirit and scope of the invention.

I claim:

1. A relaxation-type voltage controlled oscillator comprising:
   an operational transconductance amplifier for receiving an input voltage and for providing first and second differential currents respectively to first and second output terminals in response thereto;
   a charging capacitor having first and second terminals;
   means for coupling either, said first output terminal of said operational transconductance amplifier to said first terminal of said charging capacitor and said second output terminal of said operational transconductance amplifier to said second terminal of said charging capacitor, or said first output terminal of said operational transconductance amplifier to said second terminal of said charging capacitor and said second output terminal of said operational transconductance amplifier to said first terminal of said charging capacitor, selectively in response to first and second output signals of the relaxation-type voltage controlled oscillator,
   a comparator having first and second inputs respectively coupled to said first and second terminals of said charging capacitor, for providing third and fourth output signals in response thereto, said comparator characterized as having a predetermined hysteresis; and
   means for latching said third and fourth output signals to provide said first and second output signals of the relaxation-type voltage controlled oscillator.

2. The voltage controlled oscillator of claim 1 wherein said comparator comprises:
   a first transmission gate having a first terminal coupled to said first terminal of said charging capacitor, a second terminal, and operative in response to said first output signal;
   a second transmission gate having a first terminal coupled to said second terminal of said charging capacitor, a second terminal, and operative in response to said second output signal;
   a third transmission gate having a first terminal coupled to said first terminal of said charging capacitor, a second terminal, and operative in response to said second output signal;
   a fourth transmission gate having a first terminal coupled to said first terminal of said charging capacitor, a second terminal, and operative in response to said first output signal;
   a first P-channel transistor having a source coupled to said second terminal of said first transmission gate, a gate, a drain coupled to said gate, and a bulk coupled to said drain;
   a second P-channel transistor having a source coupled to said second terminal of said second transmission gate, a gate, a drain coupled to said gate, and a bulk coupled to said drain; and
   a second comparator having a positive input terminal coupled to said drain of said first P-channel transistor, a negative input terminal coupled to said drain of said second P-channel transistor, a positive output terminal for providing said third output signal, and a negative output terminal for providing said fourth output signal.

3. The voltage controlled oscillator of claim 1 wherein said operational transconductance amplifier receives said input voltage between positive and negative input terminals thereof.

4. The voltage controlled oscillator of claim 1 wherein said operational transconductance amplifier is characterized as being a folded cascode operational transconductance amplifier with source degeneration.

5. The voltage controlled oscillator of claim 1 wherein said operational transconductance amplifier includes means for adjusting a common-mode voltage thereof.

6. A fully differential relaxation-type voltage controlled oscillator comprising:
   an operational transconductance amplifier for receiving a positive and negative input terminals for receiving an input voltage therebetween, and positive and negative output terminals;
   a capacitor having first and second terminals;
   first means for coupling said positive output terminal of said operational transconductance amplifier to said first terminal of said capacitor and said negative output terminal of said operational transconductance amplifier to said second terminal of said capacitor in response to a first output signal of the oscillator;
   second means for coupling said positive output terminal of said operational transconductance amplifier to said second terminal of said capacitor and said negative output terminal of said operational transconductance amplifier to said first terminal of said capacitor in response to a second output signal of the oscillator;

a comparator having first and second input terminals respectively coupled to said first and second terminals of said capacitor, and having first and second output terminals, said comparator characterized as having a predetermined hysteresis; and means for latching at said first and second output terminals of said comparator to provide said first and second output signals of the oscillator.

7. The voltage controlled oscillator of claim 6 wherein said first means comprises:

a first transmission gate having a first terminal coupled to said positive output terminal of said operational transconductance amplifier, and a second terminal coupled to said first terminal of said capacitor, and activated in response to said second output signal of the oscillator; and a second transmission gate having a first terminal coupled to said negative output terminal of said operational transconductance amplifier, and a second terminal coupled to said second terminal of said capacitor, and activated in response to said second output signal of the oscillator.

8. The voltage controlled oscillator of claim 7 wherein said first means comprises:

a third transmission gate having a first terminal coupled to said negative output terminal of said operational transconductance amplifier, and a second terminal coupled to said first terminal of said capacitor, and activated in response to said first output signal of the oscillator; and a fourth transmission gate having a first terminal coupled to said positive output terminal of said operational transconductance amplifier, and a second terminal coupled to said second terminal of said capacitor, and activated in response to said first output signal of the oscillator.

9. The voltage controlled oscillator of claim 6 wherein said comparator comprises:

a first transmission gate having a first terminal coupled to said first terminal of said charging capacitor, a second terminal, and operative in response to said first output signal;

a second transmission gate having a first terminal coupled to said second terminal of said charging capacitor, a second terminal, and operative in response to said second output signal;

a third transmission gate having a first terminal coupled to said first terminal of said charging capacitor, a second terminal, and operative in response to said second output signal;

a fourth transmission gate having a first terminal coupled to said first terminal of said charging capacitor, a second terminal, and operative in response to said first output signal;

a first P-channel transistor having a source coupled to said second terminal of said first transmission gate, a gate, a drain coupled to said gate, and a bulk coupled to said drain;

a second P-channel transistor having a source coupled to said second terminal of said second transmission gate, a gate, a drain coupled to said gate, and a bulk coupled to said drain; and a second comparator having a positive input terminal coupled to said drain of said first P-channel transistor, a negative input terminal coupled to said drain of said second P-channel transistor, a positive output terminal for providing said third output signal, and a negative output terminal for providing said fourth output signal.

10. A comparator with hysteresis, comprising:

a first transmission gate having a first terminal for providing a positive input terminal of the comparator, a second terminal, and operative in response to a first output signal;

a second transmission gate having a first terminal for providing a negative input terminal of the comparator, a second terminal, and operative in response to a second output signal;

a third transmission gate having a first terminal coupled to said first terminal of said first transmission gate, a second terminal, and operative in response to said second output signal;

a fourth transmission gate having a first terminal coupled to said first terminal of said second transmission gate, a second terminal, and operative in response to said first output signal;

a first P-channel transistor having a source coupled to said second terminal of said first transmission gate, a gate, a drain coupled to said gate, and a bulk coupled to said drain;

a second P-channel transistor having a source coupled to said second terminal of said second transmission gate, a gate, a drain coupled to said gate, and a bulk coupled to said drain; and a comparator having a positive input terminal coupled to said drain of said first P-channel transistor, a negative input terminal coupled to said drain of said second P-channel transistor, a positive output terminal for providing a third output signal, and a negative output terminal for providing a fourth output signal, said first and second output signals respectively proportional to said third and fourth output signals.

11. A method of providing first and second output signals having a frequency proportional to an input voltage, the first and second output signals having opposite phases, comprising the steps of:

providing an input voltage differentially between positive and negative input terminals of an operational transconductance amplifier;

charging a capacitor with a differential current output of said operational transconductance amplifier in response to the first output signal;

discharging said capacitor with said differential current output of said operational transconductance amplifier in response to the second output signal;

providing the first output signal at a logic high and the second output signal at a logic low in response to a voltage between a firsts terminal of said capacitor and a second terminal of said capacitor exceeding a first predetermined value; and providing the first output signal at a logic low and the second output signal at a logic high in response to a voltage between said second terminal of said capacitor and said first terminal of said capacitor exceeding a second predetermined value.

* * * * *

UNITED STATES PATENT AND TRADEMARK OFFICE
CERTIFICATE OF CORRECTION

PATENT NO. : 5,194,831
DATED : March 16, 1993
INVENTOR(S) : H. Spence Jackson It is certified that error appears in the above-identified patent and that said Letters Patent is hereby corrected as shown below:

In the ABSTRACT, line 9, change "secon d" to --second--
Column 8, line 23, change "first" to --second--

Signed and Sealed this

Twenty-fifth Day of January, 1994

Attest:

BRUCE LEHMAN

*Attesting Officer*     *Commissioner of Patents and Trademarks*